United States Patent
Jang et al.

(10) Patent No.: US 8,847,273 B2
(45) Date of Patent: Sep. 30, 2014

(54) LIGHT EMITTING DIODE

(71) Applicant: Samsung Electronics Co. Ltd., Suwon-si (KR)

(72) Inventors: Eun Joo Jang, Suwon-si (KR); Shin Ae Jun, Seongnam-si (KR); Hyun A Kang, Suwon-si (KR); Hyo Sook Jang, Hwaseong-si (KR); Soo Kyung Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 13/656,213

(22) Filed: Oct. 19, 2012

(65) Prior Publication Data

US 2013/0099212 A1     Apr. 25, 2013

(30) Foreign Application Priority Data

Oct. 21, 2011   (KR) .......................... 10-2011-0108335

(51) Int. Cl.
| | | |
|---|---|---|
| H01L 29/24 | (2006.01) | |
| H01L 33/00 | (2010.01) | |
| C08G 77/388 | (2006.01) | |
| H05B 33/08 | (2006.01) | |
| C09D 183/04 | (2006.01) | |

(52) U.S. Cl.
CPC ............ *C09D 183/04* (2013.01); *C08G 77/388* (2013.01); *H05B 33/0803* (2013.01)
USPC .................. 257/100; 257/40; 257/95; 257/98

(58) Field of Classification Search
CPC . C09D 183/04; C08G 77/388; H05B 33/0803
USPC .................. 257/40, 91, 95, 98, 99, 100, 103, 257/E51.026
See application file for complete search history.

(56) References Cited

U.S. PATENT DOCUMENTS

| | | | |
|---|---|---|---|
| 8,436,387 B2 * | 5/2013 | Chang et al. ..................... | 257/98 |
| 8,710,532 B2 * | 4/2014 | Yamakawa et al. ............. | 257/98 |
| 2007/0287208 A1 | 12/2007 | Thompson et al. | |
| 2009/0005513 A1 | 1/2009 | Liao et al. | |
| 2010/0025724 A1 | 2/2010 | Bae et al. | |
| 2010/0324187 A1 | 12/2010 | Clarke | |
| 2011/0034581 A1 | 2/2011 | Bae et al. | |
| 2012/0267659 A1 * | 10/2012 | Chou et al. ..................... | 257/98 |

FOREIGN PATENT DOCUMENTS

| | | |
|---|---|---|
| JP | 2010192624 A | 9/2010 |
| KR | 100704883 B1 | 4/2007 |
| KR | 1020090008339 A | 1/2009 |
| KR | 1020090093202 A | 9/2009 |
| KR | 1020100013368 A | 2/2010 |
| KR | 1020110013891 A | 2/2011 |

\* cited by examiner

*Primary Examiner* — Hung Vu
(74) *Attorney, Agent, or Firm* — Cantor Colburn LLP

(57) ABSTRACT

A light emitting diode that includes: a light source; a buffer layer disposed on the light source and including a first matrix polymer; a polymer layer disposed on the buffer layer and including an organic/inorganic hybrid polymer; and an emission layer disposed on the polymer layer and including a light emitting particle dispersed in a second matrix polymer, wherein one selected from the light source, the buffer layer, the emission layer, and a combination thereof includes one selected from sulfurous component, a nitrogenous component, and a combination thereof.

18 Claims, 4 Drawing Sheets

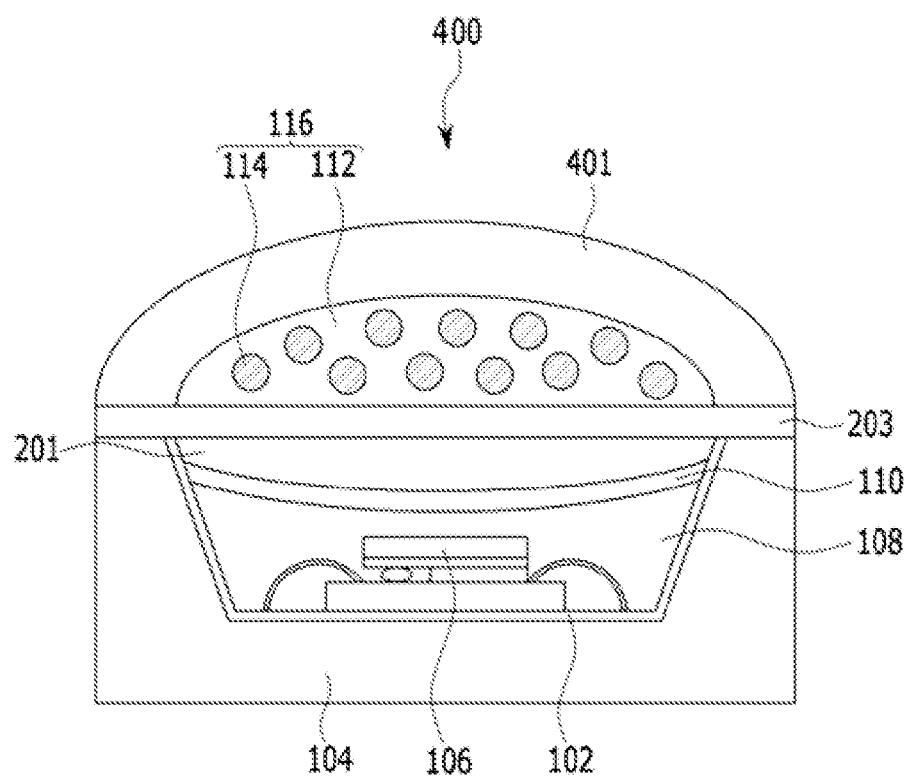

LIGHT EMITTING DIODE

This application claims priority to and the benefit of Korean Patent Application No. 10-2011-0108335, filed on Oct. 21, 2011, and all the benefits accruing therefrom under 35 U.S.C. §119, the content of which is incorporated herein by reference in its entirety.

BACKGROUND

1. Field

This disclosure relates to a light emitting diode.

2. Description of the Related Art

A light emitting diode (LED) may emit visible light from red to blue, and provide excellent color purity. A green emitting LED (i.e., a green LED), however, has a drawback in that the efficiency of the green LED is lower than the efficiency of the red and blue LEDs. Also, using three LEDs corresponding to the three colors to represent all colors of visible light has a problem of high cost.

When a blue LED or an ultraviolet (UV) LED is used, the energy of a converting wavelength is high and thus there is a merit of high energy efficiency. Therefore, it would be desirable to design a light source of a desired wavelength, e.g., a white light source, using a light converting material which provides all visible colors of light. Nonetheless, there remains a need for a LED having improved efficiency.

SUMMARY

A light converting material that may maintain similar color purity to three-color LEDs includes a sulfide-based phosphor and/or semiconductor nanocrystals (e.g., quantum dots). However, since the desirable light converting materials contain sulfur or sulfurous components, they can be sensitive to oxygen and moisture when an LED emits heat. When sulfurous components are decomposed, they may react with silver of a reflector to cause discoloration and decrease the efficiency of the LED.

Also, amine-based organic ligands, which can be bonded to the surface of the semiconductor nanocrystal or present around the semiconductor nanocrystal, may react with oxygen and moisture to cause such problems as discoloration or non-emission from the LED when the LED emits heat, thereby decreasing the efficiency.

Therefore, an embodiment provides a light emitting diode with improved efficiency and stability by including a shield layer to prevent the sulfurous components that may be present on a light source from reacting with the silver of a reflector and/or prevent an amine-based organic ligand from blocking an LED light source.

According to an embodiment, a light emitting diode is provided that includes: a light source; a buffer layer disposed on the light source and including a first matrix polymer; a polymer layer disposed on the buffer layer and including an organic/inorganic hybrid polymer; and an emission layer disposed on the polymer layer and including a light active particle dispersed in a second matrix polymer, wherein one selected from the light source, the buffer layer, the emission layer, and a combination thereof includes one selected from a sulfurous component, a nitrogenous component, and a combination thereof.

The light active particle may be a light absorbing particle and/or a light emitting particle, and may be selected from a phosphor, a semiconductor nanocrystal, a metal nanocrystal, a metal oxide nanocrystal, and a combination thereof. The semiconductor nanocrystal may be selected from a Group II-VI compound, a Group III-V compound, a Group IV-VI compound, a Group IV element, a Group IV compound, and a combination thereof.

A polymer having a carboxyl group (—COOH) or a salt thereof may be disposed on the light active particle. The polymer may be selected from a poly(alkylene-co-acrylic acid), a poly(alkylene-co-methacrylic acid), a salt thereof, and a combination thereof.

The organic/inorganic hybrid polymer may include a first moiety including a siloxane bond (—Si—O—Si— wherein each Si is tetravalent), a second moiety including a siloxane bond and at least one organic functional group, and a third moiety including a siloxane bond and a cross-linked structure of at least one reactive functional group.

The organic/inorganic hybrid polymer may further include a fourth moiety including an —O-M-O— bond wherein M is selected from Al, Sn, Ti, Zr, Ge, B, and a combination thereof.

The polymer layer including the organic/inorganic hybrid polymer may have porosity of greater than or equal to about 5 volume %.

The light emitting diode may further include an interlayer selected from a second buffer layer including a third matrix polymer, a transparent plate, and a combination thereof between the polymer layer including the organic/inorganic hybrid polymer, and the emission layer.

The light emitting diode may further include a polymer barrier film disposed on the emission layer. The polymer barrier film may be a polymer of a first monomer including at least two thiol (—SH) groups at a terminal end and a second monomer including at least two carbon-carbon unsaturated bond-containing groups. The polymer barrier film may include a first polymer layer including a first polymer of a first monomer including at least two thiol (—SH) groups at a terminal end and a siloxane second monomer or oligomer including at least one carbon-carbon unsaturated bond at a terminal end, and a second polymer layer including a second polymer of a third monomer including at least two thiol (—SH) groups at a terminal end and a fourth monomer including at least two carbon-carbon unsaturated bond-containing group.

The second matrix polymer may be a silicone resin or a polymer which is a product of curing a siloxane second monomer or oligomer including at least one carbon-carbon unsaturated bond of the first polymer layer.

Also disclosed is a method of manufacturing a light emitting diode, the method including: disposing a light source; disposing a buffer layer including a first matrix polymer on the light source; disposing a polymer layer on the buffer layer, wherein the polymer layer includes an organic/inorganic hybrid polymer; and disposing an emission layer on the polymer layer, wherein the emission layer includes a light emitting particle dispersed in a second matrix polymer, wherein one selected from the light source, the buffer layer, the emission layer, and a combination thereof includes one selected from a sulfurous component, a nitrogenous component, and a combination thereof.

An embodiment of this disclosure will be further described in the following detailed description.

BRIEF DESCRIPTION OF THE DRAWINGS

The above and other aspects, advantages and features of this disclosure will become more apparent by describing in further detail exemplary embodiments thereof with reference to the accompanying drawings, in which:

FIGS. 1 to 4 are cross-sectional views of embodiments of light emitting diodes.

DETAILED DESCRIPTION

Figure 1:
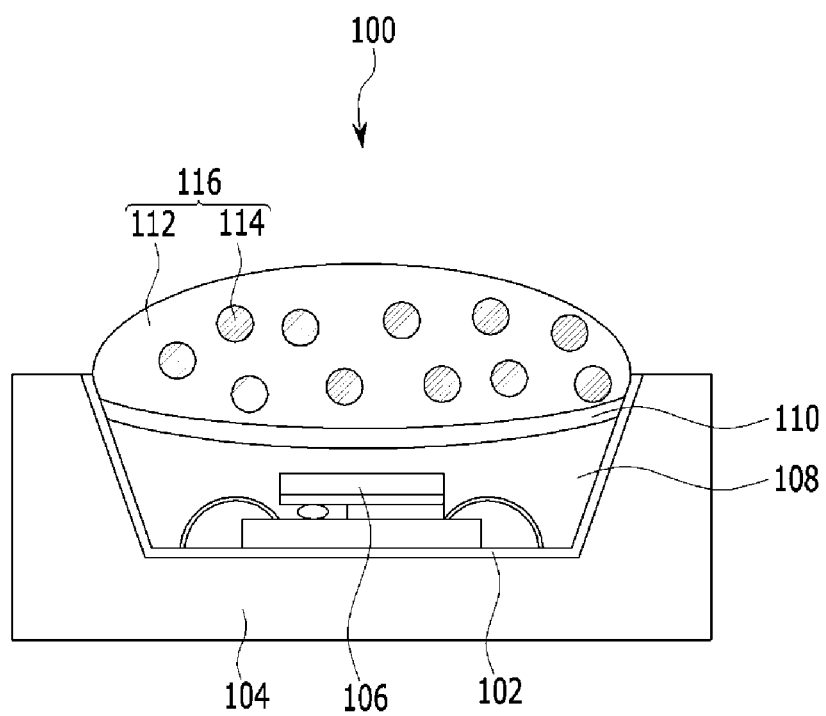

This disclosure will be described more fully hereinafter in the following detailed description of this disclosure, in which some but not all embodiments of this disclosure are disclosed. This disclosure may be embodied in many different forms and is not be construed as limited to the embodiments set forth herein; rather, these embodiments are provided so that this disclosure will fully convey the scope of the invention to those skilled in the art.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" may refer to a compound or group substituted with a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (e.g., —F, —Cl, —Br or —I), a hydroxyl group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR wherein R is a C1 to C6 alkyl group or a C6 to C12 aryl group), a carboxyl group (—C(=O)OH) or a salt thereof (—C(=O)OM wherein M is an organic or inorganic cation), a sulfonic acid group (—SO$_3$H) or a salt thereof (—SO$_3$M wherein M is an organic or inorganic cation), or a phosphoric acid group (—PO$_3$H$_2$) or a salt thereof (—PO$_3$MH or —PO$_3$M$_2$ wherein M is an organic or inorganic cation), instead of hydrogen, provided that the substituted atom's normal valence is not exceeded.

As used herein, when a definition is not otherwise provided, the prefix "hetero" refers to a compound or group that includes a heteroatom selected from N, O, S, Si, and P.

As used herein, the term "aliphatic organic group" may refer to a C1 to C30 linear or branched alkyl group, the term "aromatic organic group" may refer to a C6 to C30 aryl group or a C2 to C30 heteroaryl group, and the term "alicyclic organic group" may refer to a C3 to C30 cycloalkyl group, a C3 to C30 cycloalkenyl group, or a C3 to C30 cycloalkynyl group. As used herein, the term "carbon-carbon unsaturated bond-containing substituent" may refer to a C2 to C20 alkenyl group including at least one carbon-carbon double bond, a C2 to C20 alkynyl group including at least one carbon-carbon triple bond, a C4 to C20 cycloalkenyl group including at least one carbon-carbon double bond in a ring, or a C4 to C20 cycloalkynyl group at least one carbon-carbon triple bond in a ring.

As used herein, the term "combination thereof" refers to a mixture, a stacked structure, a composite, an alloy, a blend, a reaction product, or the like. As used herein, (meth)acrylate may refer to acrylate and methacrylate, and (meth)acryloyloxy may refer to acryloyloxy and methacryloyloxy.

As used herein, a "light active" particle may be a light emitting particle and/or a light absorbing particle.

As used herein a "sulfurous component" may be elemental sulfur or a sulfur-based component containing sulfur as part of a compound, specifically an organic compound.

As used herein a "nitrogenous component" may be a nitrogen-based component containing nitrogen as part of a compound, specifically an organic compound such as an amine group.

According to an embodiment, a light emitting diode includes: a light source; a buffer layer disposed on the light source and comprising a first matrix polymer; a polymer layer disposed on the buffer layer and comprising an organic/inorganic hybrid polymer; and an emission layer disposed on the polymer layer and comprising a light active particle dispersed in a second matrix polymer, wherein at least one member disposed on the polymer layer, e.g., one selected from the light source, the buffer layer, the emission layer, and a combination thereof, includes one selected from a sulfurous component, a nitrogenous component, and a combination thereof.

Hereinafter, a light emitting diode according to an embodiment is described referring to FIG. 1.

FIG. 1 is a cross-sectional view of a light emitting diode 100 according to an embodiment. Referring to FIG. 1, the light emitting diode 100 includes: a substrate 104 including a reflector 102 (e.g., a silver reflector), a light source 106 corresponding to a blue or ultraviolet (UV) region and disposed on the reflector 102, a buffer layer 108 disposed on the light source 106 and including a first matrix polymer, a polymer layer 110 disposed on the buffer layer 108 and including an organic/inorganic hybrid polymer; and an emission layer 116 disposed on the polymer layer 110 including the organic/inorganic hybrid polymer, wherein the emission layer 116 includes light active particles 114 dispersed in a second matrix polymer 112.

The reflector may comprise silver or a silver alloy, may consist of silver, and may be a silver plated reflector.

The light source 106 of the light emitting diode 100 may include a light emitting diode chip, a laser, a lamp, and the like.

The first matrix polymer of the buffer layer 108 may comprise one selected from a silicone resin; an epoxy resin; a (meth)acrylate-based resin; a polycarbonate; a polystyrene; a polyolefin such as polyethylene, polypropylene, polyisobutylene, and the like; and a combination thereof.

The buffer layer 108 does not include light active particles.

The buffer layer 108 including the first matrix polymer may protect a wire connecting the light source 106 and an electrode from being damaged in a process of applying an emission layer or other encapsulation materials of a subsequent process, and may minimize the time that the light source 106 is exposed to the atmosphere. Particularly, when a soft polymer, such as a silicone is used as the first matrix polymer, the wire may be protected based on the buffering ability of the soft polymer, and a defect ratio of the LED may be decreased as compared to an embodiment in which a hard polymer is used. Also, the light extraction from the light source 106 may be more efficient when the refractive index of the buffer layer 108 including the first matrix polymer is suitably selected.

To select the refractive index of the buffer layer 108 including the first matrix polymer, inorganic nanoparticles having a high refractive index may be disposed in the buffer layer 108. Also, the refractive index of the buffer layer 108 including the first matrix polymer may be selected by selecting the density of the inorganic nanoparticles. Non-limiting examples of the inorganic nanoparticles include metal oxide particles, e.g., silica, alumina, titania, and zirconia, and the refractive index of the buffer layer 108 including the first matrix polymer may be selected to be about 1.2 to about 1.8, specifically about 1.4 to about 1.6.

The organic/inorganic hybrid polymer of the polymer layer 110 may include a first moiety including a siloxane bond (—Si—O—Si— wherein each Si is tetravalent), a second moiety including a siloxane bond and an organic functional group, and a third moiety including a siloxane bond and a cross-linked structure comprising a reactive functional group.

The organic/inorganic hybrid polymer may further include a fourth moiety including a —O-M-O— bond wherein M is selected from Al, Sn, Ti, Zr, Ge, B, and a combination thereof.

The organic/inorganic hybrid polymer may be a condensation polymerization polymer of a first alkoxy silane of the following Chemical Formula 1, a second alkoxy silane of the following Chemical Formula 2, and a third alkoxysilane of the following Chemical Formula 3.

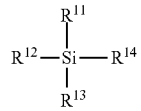

Chemical Formula 1

In Chemical Formula 1, $R^{11}$ to $R^{14}$ are each independently a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group.

The alkoxy silane of the above Chemical Formula 1 may include tetramethoxysilane, tetraethoxysilane, tetrabutoxysilane, and the like.

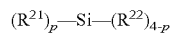

Chemical Formula 2

In Chemical Formula 2, $R^{21}$ is a substituted or unsubstituted C6 to C20 aryl group, a substituted or unsubstituted C1 to C20 linear or branched alkyl group, for example a fluoroalkyl group, a substituted or unsubstituted C1 to C20 aminoalkyl group, a substituted or unsubstituted C2 to C20 alkynyl group, C2 to C20 alkenyl group, a substituted or unsubstituted C1 to C20 amine group, —C(=O)OR' (wherein R' is a C1 to C20 linear or branched alkyl group) or —C(=O)ONRR' (wherein R and R' are independently a C1 to C20 linear or branched alkyl group), $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and p is an integer ranging from 1 to 3.

The alkoxy silane of the above Chemical Formula 2 may include methyltrimethoxysilane, ethyltrimethoxysilane, propyltrimethoxysilane, butyltrimethoxysilane, pentyltrimethoxysilane, hexyltrimethoxysilane, methyltriethoxysilane, ethyltriethoxysilane, propyltriethoxysilane, butyltriethoxysilane, pentyltriethoxysilane, hexyltriethoxysilane, dimethyldimethoxysilane, diethyldimethoxysilane, dipropyldimethoxysilane, dibutyldimethoxysilane, dipentyldimethoxysilane, dihexyldimethoxysilane, dimethyldiethoxysilane, diethyldiethoxysilane, dipropyldiethoxysilane, dibutyldiethoxysilane, dipentyldiethoxysilane, dihexyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, phenyltrimethoxysilane, diphenyldimethoxysilane, phenyltriethoxysilane, diphenyldiethoxysilane, and the like.

$$(R^{31})_q—Si—(R^{32})_{4-p} \quad \text{Chemical Formula 3}$$

In Chemical Formula 3, $R^{31}$ is a reactive functional group being capable of producing a photo-cross-linking bond or a thermal cross-linking bond, specifically a (meth)acryloxy group; an epoxy group, for example a glycidyloxy group; a spiroorthoester group; a C2 to C30 alkenyl group; a C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; or a C3 to C30 heterocycloalkyl group substituted with a C2 to C30 alkenyl group or a C2 to C30 alkynyl group, $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and q is an integer ranging from 1 to 3.

The organic/inorganic hybrid polymer may be a condensation polymerization polymer of the alkoxy silane compounds represented by the above Chemical Formulas 1 to 3 and an alkoxide compound represented by the following Chemical Formula 4.

$$M(R)_r \quad \text{Chemical Formula 4}$$

In Chemical Formula 4,

R is a hydroxy group, a halogen, a substituted or unsubstituted C1 to C8 linear or branched alkoxy group, for example, a methoxy group, an ethoxy group, an isopropoxy group, or a t-butoxy group, a substituted or unsubstituted C6 to C12 aryloxy group, a substituted or unsubstituted C2 to C10 carbonylalkyl group, or a substituted or unsubstituted C2 to C10 carbonylalkoxy group, and M is selected from Al, Si, Sn, Ti, Zr, Ge, B, and a combination thereof, and r is determined depending on a bonding valence of M.

The first to third moieties may be derived from the above Chemical Formulas 1 to 3, respectively. The first alkoxy silane represented by Chemical Formula 1 undergoes condensation polymerization to provide a first moiety including a siloxane bond (—Si—O—Si— wherein each Si is tetravalent), the second alkoxy silane represented by Chemical Formula 2 undergoes condensation polymerization to provide a second moiety including a siloxane bond and at least one organic functional group, and the third alkoxy silane represented by Chemical Formula 3 undergoes condensation polymerization to provide a third moiety including a siloxane bond and a cross-linked structure of at least one reactive functional group. Therefore, the organic functional group of the second moiety may be $R^{21}$ of Chemical Formula 2, and the cross-linked organic functional group of the third moiety is provided by cross-linking of $R^{31}$, a reactive functional group being capable of producing a photo-cross-linking bond or a thermal cross-linking bond of Chemical Formula 3.

The second moiety may increase flexibility and the refractive index of the condensation polymerization polymer.

The first alkoxy silane, the second alkoxy silane, and the third alkoxide compound may be used in each amount of about 0.5 wt % to about 55 wt %, about 35 wt % to about 99 wt %, and about 0.01 wt % to about 10 wt %. The first alkoxy silane may be used in an amount of about 50 wt % to about 55 wt %. When the first alkoxy silane to the third alkoxy silane undergo condensation polymerization within the above range, a polymer layer 110 including an organic/inorganic hybrid polymer having an excellent refractive index, and photo-stability and thermal stability may be formed.

The polymer layer 110 including the organic/inorganic hybrid polymer does not include light active particles.

The polymer layer 110 including the organic/inorganic hybrid polymer has a dense structure which may be effective to block oxygen and/or moisture transferred from the outside. The polymer layer 110 may mitigate a low density of the buffer layer 108 that protects the light source 106 and the wire. Particularly, in an embodiment in which the reflector 102 comprises silver, the polymer layer 110 including the organic/inorganic hybrid polymer may substantially or effectively prevent the silver of the reflector 102 from discoloring, as the sulfur-based component or amine-based component may react with the silver component of the reflector 102, which is disposed under the polymer layer 110. The sulfur-based component or amine-based component may be present on at least one member, such as light active particles, an encapsulation material, and/or a barrier film disposed in the upper portion of the polymer layer 110 including the organic/inorganic hybrid polymer.

The reflector 102 converges light in a direction to be extracted from the light source 106. Due to the silver, the luminance may be changed in a range of about 10 to about 20%. As the silver reacts with sulfur to become silver sulfide (AgS), the color of the reflector 102 may change to yellow or brown and it may not suitably reflect light due to the discoloration, thereby deteriorating the luminance of the light emitting diode. The amine-based component may color the silver yellow, and it may also alter the color of the light source 106 to decrease the efficiency of the light source 106.

The polymer layer 110 including the organic/inorganic hybrid polymer may have porosity of less than or equal to about 5 volume %, specifically about 0.1 to about 5 volume %, more specifically about 1 to about 4 volume %. Specifically, the polymer layer 110 may have porosity of about 0.5 to about 0.001 volume %. Also, a third portion of the organic/inorganic hybrid polymer may decrease the porosity by making the polymer layer 110 including the organic/inorganic hybrid polymer more dense in a structure wherein at least one reactive functional group is cross-linked. When the porosity is within the foregoing range, the reflector 102 may be substantially or effectively prevented from discoloring and/or the light source 106 may be substantially or effectively prevented from being contaminated by effectively blocking the sulfurous component or amine-based component, which may be present above the polymer layer 110 including the organic/inorganic hybrid polymer.

The polymer layer 110 including the organic/inorganic hybrid polymer may have a thickness of about 5 micrometers (μm) to about 200 μm. Specifically, the polymer layer 110 may have a thickness of about 20 μm to about 100 μm. When the polymer layer 110 has a thickness in the foregoing range, the reflector 102 may be substantially or effectively prevented from discoloring and the structure of the light emitting diode 100 may maintain appropriate dimensions by effectively blocking the sulfurous component or amine-based component, which may be present above the polymer layer 110 including the organic/inorganic hybrid polymer. As a result, the efficiency of the light emitting diode 100 may be improved, and the efficiency may be substantially or effectively prevented from being deteriorated when the light emitting diode 100 operates for a long time.

In an embodiment, the luminance of the light emitting diode after 250 hours may be greater than about 80%, specifically greater than about 90%, more specifically about 80 to about 110% of an initial luminance, i.e., a luminance at zero hours.

The emission layer 116 disposed on (e.g., over) the polymer layer 110 including the organic/inorganic hybrid polymer includes the light active particles 114 dispersed in the second matrix polymer 112.

The second matrix polymer 112 may include one selected from a silicone resin; an epoxy resin; a (meth)acrylate-based resin; a polycarbonate; a polystyrene; a polyolefin such as polyethylene, polypropylene, polyisobutylene, and the like; a copolymer of a first monomer including at least two thiol (—SH) groups at a terminal end and a second monomer including at least two carbon-carbon unsaturated bond-containing group; and a combination thereof. The first monomer including at least two thiol (—SH) groups at a terminal end may be represented by the following Chemical Formula 5.

  Chemical Formula 5

In Chemical Formula 5,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR' wherein R and R' are independently hydrogen, or a linear or branched C1 to C15 alkyl group); an isocyanurate group; a (meth)acrylate group; a halogen; —ROR' (wherein R is a substituted or unsubstituted C1 to C20 alkylene group and R' is hydrogen or a C1 to C20 linear or branched alkyl group); —C(=O)OR' (wherein R' is hydrogen or a C1 to C20 linear or branched alkyl group); —CN; or —C(=O)ONRR' (wherein R and R' are independently hydrogen or a C1 to C20 linear or branched alkyl group), $L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—$CH_2$—) is substituted with a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR— wherein R is hydrogen or a C1 to C10 linear or branched alkyl group), an amine group (—NR— wherein R is hydrogen or a C1 to C10 linear or branched alkyl group), or a combination thereof, m is an integer of greater than or equal to 1, k1 is an integer of 0 or greater than or equal to 1, k2 is an integer of greater than or equal to 1, and the sum of m and k2 is an integer of 3 or more; provided that m does not exceed the valence of $Y_1$; and provided that the sum of k1 and k2 does not exceed the valence of $L_1$.

The second monomer including at least two carbon-carbon unsaturated bond-containing group may be represented by the following Chemical Formula 6.

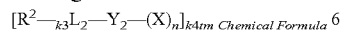 Chemical Formula 6

In Chemical Formula 6,

X is a C2 to C30 aliphatic organic group including a carbon-carbon unsaturated bond, a C6 to C30 aromatic organic group including a carbon-carbon double bond or a carbon-carbon triple bond, or a C3 to C30 alicyclic organic group including a carbon-carbon double bond or a carbon-carbon triple bond, $R^2$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR' wherein R and R' are independently hydrogen or a C1 to C15 linear or branched alkyl group); an isocyanate group; an isocyanurate group; a (meth)acryloxy group; a halogen; —ROR' (wherein R is a substituted or unsubstituted C1 to C20 alkylene group and R' is hydrogen or a C1 to C20 linear or branched alkyl group); an acyl halide group (—RC(=O)X wherein R is a substituted or unsubstituted alkylene group and X is a halogen); —C(=O)OR' (wherein R' is hydrogen or a C1 to C20 linear or branched alkyl group); —CN; or —C(=O)ONRR' (wherein R and R' are independently hydrogen or a C1 to C20 linear or branched alkyl group), $L_2$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—$CH_2$—) is substituted with a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR— (wherein R is hydrogen or a C1 to C10 linear or branched alkyl group), an amine group (—NR— wherein R is hydrogen or a C1 to C10 linear or branched alkyl group), or a combination thereof, n is an integer of greater than or equal to 1, k3 is an integer of 0 or greater than or equal to 1, k4 is an integer of greater than or equal to 1, and the sum of n and k4 is an integer of greater than or equal to 3; provided that n does not exceed the valence of $Y_2$; and provided that the sum of k3 and k4 does not exceed the valence of $L_2$.

The first monomer of the above Chemical Formula 5 may include a monomer of the following Chemical Formula 5-1.

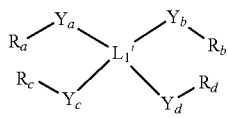

Chemical Formula 5-1

In Chemical Formula 5-1, $L_1'$ is a substituted or unsubstituted C1 to C30 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are each independently selected from a substituted or unsubstituted C1 to C30 alkylene group; a substituted or unsubstituted C2 to C30 alkenylene group; or a C1 to C30 alkylene group or a C2 to C30 alkenylene group wherein at least one methylene group (—CH$_2$—) is substituted with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR— wherein R is hydrogen or a C1 to C10 linear or branched alkyl group), an amine group (—NR— wherein R is hydrogen or a C1 to C10 linear or branched alkyl group), and a combination thereof, and $R_a$ to $R_d$ are each independently a thiol group (—SH) or one or more of the groups —$R_a$—$Y_a$—, —$R_b$—$Y_b$—, $R_c$—$Y_c$—, and $R_d$—$Y_d$— are $R_1$ of Chemical Formula 5, provided that at least two of $Y_a$ to $Y_d$ are as defined above and at least two of $R_a$ to $R_d$ are thiol groups (—SH).

In a specific embodiment of Chemical Formula 6, X is an acryloxy group; a methacryloxy group; a C2 to C30 alkenyl group; a C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; or a C3 to C30 heterocycloalkyl group substituted with a C2 to C30 alkenyl group or a C2 to C30 alkynyl group.

In the definitions of X of Chemical Formula 6, the substituted or unsubstituted C3 to C30 alicyclic organic group including a double bond or triple bond in a ring may be selected from a norbornene group, a maleimide group, a nadimide group, a tetrahydrophthalimide group, and a combination thereof.

Further in a specific embodiment of Chemical Formula 6, $L_2$ may be a substituted or unsubstituted pyrrolidinyl group, a substituted or unsubstituted tetrahydrofuranyl group, a substituted or unsubstituted pyridyl group, a substituted or unsubstituted pyrimidyl group, a substituted or unsubstituted piperidyl group, a substituted or unsubstituted triazinyl group, a substituted or unsubstituted trioxotriazinyl group, or a substituted or unsubstituted isocyanurate group.

The second monomer of the above Chemical Formula 6 may include the compounds represented by the following Chemical Formulas 6-1 and 6-2.

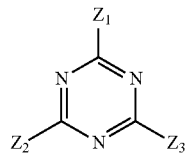

Chemical Formula 6-1

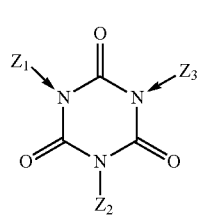

Chemical Formula 6-2

In Chemical Formulas 6-1 and 6-2, $Z_1$ to $Z_3$ are each independently *—$Y_2$—$X_n$ of the above Chemical Formula 6 wherein * represents the point of attachment to $L_2$.

Specific examples of the second monomer of the above Chemical Formula 6 may include the compounds represented by the following Chemical Formulae 6-3 to 6-5.

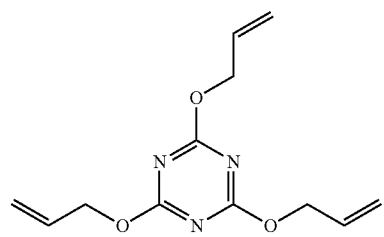

Chemical Formula 6-3

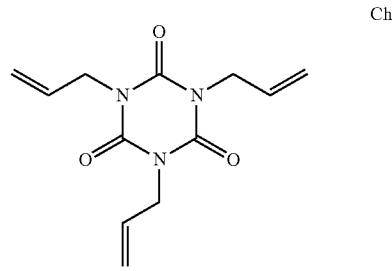

Chemical Formula 6-4

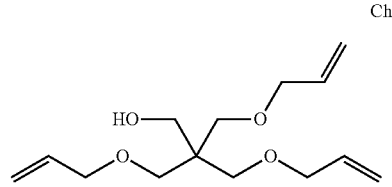

Chemical Formula 6-5

The first monomer and the second monomer may be used so that the thiol group of the first monomer and the unsaturated carbon-carbon bond of the second monomer may be present at a mole ratio of about 1:0.75 to about 1:1.25.

The copolymer may be a polymerized product that is obtained by further polymerizing a monomer having one thiol group located at a terminal end, and a monomer having one unsaturated carbon-carbon bond at a terminal end. The first monomer and the second monomer may be polymerized under the presence of an initiator for accelerating the cross-linking reaction of the thiol group and carbon-carbon unsaturated bond. The initiator may include phosphine oxide, α-amino ketone, phenylglyoxylate, monoacyl phosphine, benzylmethyl-ketal, hydroxyketone, and the like.

The light active particles 114 may be light absorbing particles and/or light emitting particles, and may comprise red, green, yellow, or blue light emitting particles. The light active particles may be selected from nanocrystal, a phosphor, and a combination thereof. The nanocrystal may be selected from a semiconductor nanocrystal, a metal nanocrystal, a metal oxide nanocrystal, and a combination thereof. The semiconductor nanocrystal may be selected from a Group II-VI compound, a Group III-V compound, a Group IV-VI compound, a Group IV element, a Group IV compound, and a combination thereof.

The Group II-VI compound may include a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound includes a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; or a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound includes a binary compound selected from SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; or a quaternary compound selected from SnPbSSe, SnPbSeTe, SnPbSTe, and a combination thereof. The Group IV element includes Si, Ge, or a combination thereof. The Group IV compound includes a binary compound selected from SiC, SiGe, or a combination thereof.

Herein, the element, the binary compound, the ternary compound, the quaternary compound, or the combination may be present as particles having a substantially uniform concentration, or may be present as particles having different concentration distributions. In addition, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to the center of the particle.

In addition, the semiconductor nanocrystal may have a structure including a semiconductor nanocrystal core and a multi-layer shell surrounding the same. The multi-layer shell may have a two or more layered shell structure. Each layer may have a monocomposition or an alloy or concentration gradient.

In addition, the semiconductor nanocrystal may have a structure effectively showing the quantum confinement effect since the material composition for the shell has a higher energy band gap than that of the core. In the case of having a multi-layered shell, the energy band gap of the shell disposed on the exterior of the core is higher than that of the shell closer to the core. The semiconductor nanocrystal may have an ultraviolet (UV) to infrared wavelength range.

The semiconductor nanocrystal may have quantum efficiency of about 30% to about 100%, for example, about 50% or more, or 70% or more, or about 90% or more. Within the range, it may improve the luminous efficiency of a device.

In addition, the full width of half maximum (FWHM) of the light emitting wavelength spectrum of the semiconductor nanocrystal may be selected to be narrower or wider according to the application field. It may have a narrower spectrum in order to improve the color purity or the color reproducibility in a display. The semiconductor nanocrystal may have the FWHM of light emitting wavelength spectrum of less than or equal to about 50 nanometers (nm), for example, less than or equal to about 40 nm, or less than or equal to about 30 nm, specifically about 5 to about 50 nm, specifically about 10 to about 40 nm. In the foregoing range, it may improve the color purity or the color reproducibility of the device. In addition, when the semiconductor nanocrystal is used for lighting or the like, semiconductor nanocrystals having various light emitting wavelengths may be combined in order to improve the color rendering index (hereinafter, "CRI"), or the FWHM may be designed to be wider. In this case, the FWHM may range from about 100 to about 200 nm.

The nanocrystal may have a particle diameter (e.g., an average largest particle diameter) ranging from about 1 nanometer (nm) to about 100 nm, and specifically about 1 nm to about 10 nm.

In addition, the nanocrystal may have a commonly-used shape in this art so is not specifically limited, but examples thereof may include spherical, pyramidal, multi-armed, or cubic nanoparticles, nanotubes, nanowires, nanofiber, nanoplate particles, or the like.

The nanocrystal may be synthesized according to the general method known in this art. For example, it may be synthesized according to the following method. The method of synthesizing nanocrystal is not limited to the following method, and it may be synthesized according to any method known as the conventional arts.

The phosphor and pigment used in the light emitting particle-polymer composite may be a generally-used phosphor and pigment without limitation. The phosphor or pigment may have a particle diameter ranging from about 1 nm to about 100 nm, and in one embodiment, ranging from about 1 nm to about 10 nm. The particle diameter may refer to the longest size when the semiconductor nanocrystal does not have a spherical shape.

The phosphor may include a sulfide-based phosphor such as ZnS, CdS, CaS, SrS, and the like; the forgoing sulfide-based phosphor doped with an element selected from Ag, Cu, Mg, Mn, Cl, Co, and a combination thereof; an oxide-based phosphor; a nitride-based phosphor, and combination thereof. For example, the phosphor may be selected from $Gd_2O_2S$:Tb, $Gd_2O_2S$:Eu, $Gd_2O_2S$:Pr, $Gd_2O_2S$:Pr,Ce,F, $Y_2O_2S$:Tb, $Y_2O_2S$:Eu, $Y_2O_2S$:Pr, $Zn_{0.5}Cd_{0.4}S$:Ag, Zn 0.4Cd 0.6S:Ag, $CdWO_4$, $CaWO_4$, $MgWO_4$, $Y_2SiO_5$:Ce, $YAlO_3$:Ce, $Y_3Al_5O_{12}$:Ce, $Y_3(Al,Ga)_5O_{12}$:Ce, CdS:In, ZnO:Ga, ZnO:Zn, (Zn, Cd)S:Cu,Al, ZnS:Cu,Al,Au, ZnCdS:Ag,Cu, ZnS:Ag, $Zn_2SiO_4$:Mn, ZnS:Cu, NaI:Tl, CsI:Tl, 6LiF/ZnS:Ag, 6LiF/ZnS:Cu,Al,Au, and a combination thereof.

When the light active particles 114 include a sulfurous component or nitrogenous component, or when the organic ligands existing on the surface of the light active particles 114 include a sulfurous component or nitrogen component, the sulfurous component or nitrogenous component may be decomposed and transport out, e.g. by diffusion, or may react with moisture and/or oxygen and transport out during the heat emission or optical excitation of the LED.

A polymer having a carboxyl group (—COOH) or a salt thereof may be disposed on, e.g., coated on, the light active particles 114. The carboxyl group may include an acrylic acid group, a methacrylic acid group, or a salt thereof. The polymer having a carboxyl group (—COOH) or a salt thereof may include about 1 to about 100 wt %, for example about 3 to about 50 wt %, of a structural unit including the carboxyl group or a salt thereof. When the carboxyl group or a salt thereof is included within the above range in the polymer, stability of the light emitting particle may be improved. The polymer may have a melting point ($T_m$) of about 50 to about 300° C. When the polymer has a melting point within the above range, the polymer may provide a coating on the light emitting particle having improved stability.

The coated light emitting particle may be present in a powder or film form. A coated light emitting particle in a form of a powder and a matrix polymer may be combined to provide a composite, or alternatively, a coated light emitting particle in a form of a film and a matrix polymer are mixed to provide a composite. The polymer having a carboxyl group (—COOH) or a salt thereof includes the carboxyl group or a salt thereof in a long aliphatic chain.

The polymer having a carboxyl group or a salt thereof may include poly(alkylene-co-acrylic acid), poly(alkylene-co-methacrylic acid), a salt thereof, or a combination thereof. The salt is a metal salt compound including a metal such as sodium, zinc, indium, gallium, and the like instead of hydrogen of the carboxyl group. Examples of the salt include a poly(ethylene-co-acrylic acid) zinc salt, a poly(ethylene-co-methacrylic acid) zinc salt, and the like.

The polymer having a carboxyl group (—COOH) or a salt thereof may be present in an amount of about 50 to about 10,000 parts by weight, for example about 200 to about 10,000 parts by weight, based on 100 parts by weight of the light active particles 114. In the light active particles coated with the polymer having a carboxyl group (—COOH) or a salt thereof, the light active particles may be present in an amount of about 1 to about 70 wt %, for example about 1 to about 50 wt %, based on the total weight of the light active particles and the polymer having a carboxyl group (—COOH) or a salt thereof. When present within the foregoing range, stability of the light active particles may be improved.

The light emitting diode in accordance with another embodiment may further include an interlayer between the buffer layer and the polymer layer. The interlayer may be selected from a transparent plate, a second buffer layer including a third matrix polymer, and a combination thereof. The light emitting diode comprising an interlayer is described with reference to FIG. 2.

Figure 2:
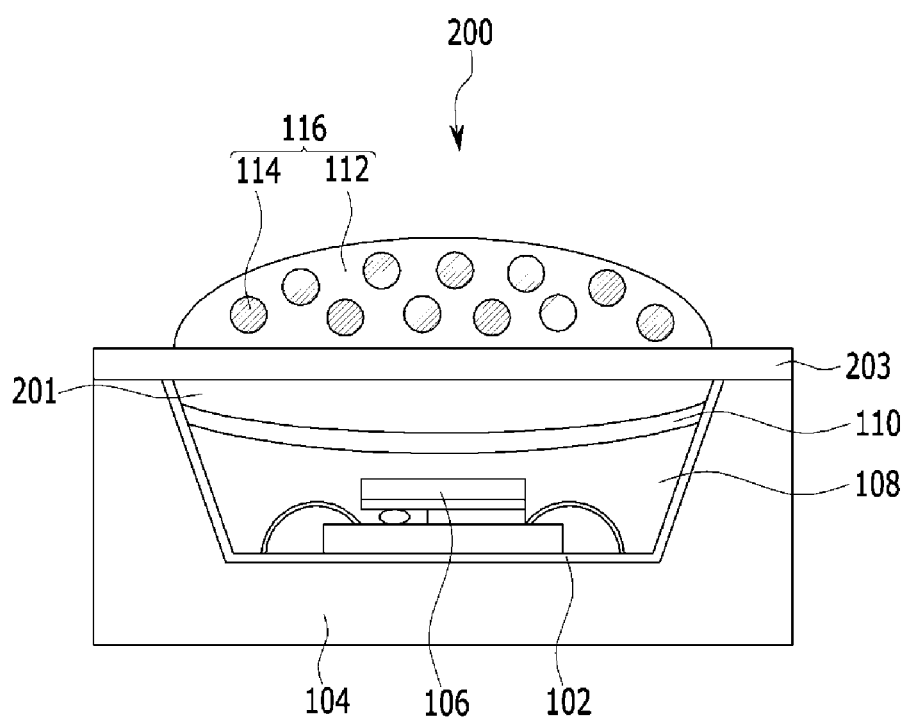

FIG. 2 is a cross-sectional view of a light emitting diode 200 according to another embodiment. Referring to FIG. 2, the light emitting diode 200 includes a substrate 104 including a reflector 102, a light source 106 corresponding to a blue or ultraviolet (UV) region on the reflector 102, a first buffer layer 108 including a first matrix polymer and disposed on the light source 106, a polymer layer 110 including an organic/inorganic hybrid polymer and disposed on the buffer layer 108, a second buffer layer 201 disposed on the polymer layer 110 and including a third matrix polymer, a transparent plate 203 disposed on the second buffer layer 201, and an emission layer 116 including light active particles 114 that are dispersed in the second matrix polymer 112 disposed on the transparent plate 203.

The third matrix polymer may be a silicone resin; an epoxy resin; a (meth)acrylate-based resin; a polycarbonate; a polystyrene; a polyolefin such as polyethylene, polypropylene, polyisobutylene, and the like; a copolymer of a first monomer including at least two thiol (—SH) groups at a terminal end and a second monomer including at least two carbon-carbon unsaturated bond-containing group; or a combination thereof. The first monomer and the second monomer are the same as described in the second matrix polymer 112 of the emission layer 116.

The transparent plate 203 may comprise a glass or a transparent polymer. Since the transparent plate 203 may block heat generated in the light source 106, the transparent plate 203 may reduce or prevent degradation of the light active particles 114.

The second buffer layer 201 does not include light active particles.

Figure 3:
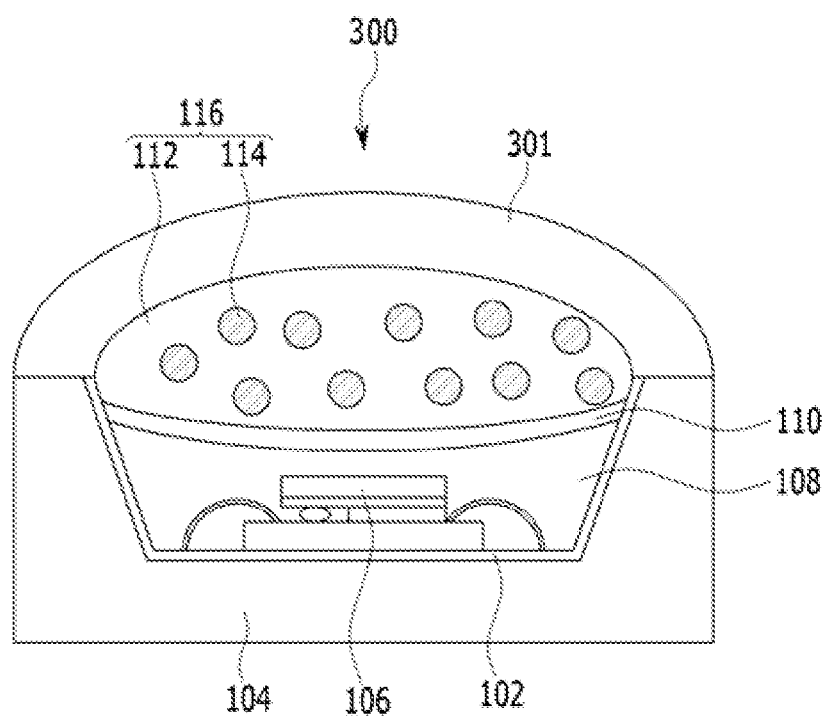

The light emitting diodes 100 and 200 may further include a polymer barrier film disposed on the emission layer 116. FIG. 3 shows a light emitting diode 300 including a polymer barrier film 301 disposed in the light emitting diode 100 of FIG. 1, and FIG. 4 shows a light emitting diode 400 including a polymer barrier film 401 disposed in the light emitting diode 200 of FIG. 2. The polymer barrier films 301 and 401 may include a polymer of a first monomer including at least two thiol (—SH) groups at a terminal end and a second monomer including at least two carbon-carbon unsaturated bond-containing group. The first monomer and the second monomer are the same as described in the second matrix polymer 112 of the emission layer 116.

The polymer barrier films 301 and 401 may include a first polymer layer including a first polymer of a first monomer including at least two thiol (—SH) groups at a terminal end and a siloxane-based second monomer or oligomer including at least one carbon-carbon unsaturated bond at a terminal end; and a second polymer layer including a second polymer of a third monomer including at least two thiol (—SH) groups at a terminal end and a fourth monomer including at least two carbon-carbon unsaturated bond-containing group. The first monomer including at least two thiol (—SH) groups at a terminal end and the third monomer including at least two thiol (—SH) groups at a terminal end are the same as the first monomer of the second matrix polymer 112, and the fourth monomer having at least two carbon-carbon unsaturated bonds is the same as the second monomer of the second matrix polymer 112.

The siloxane-based second monomer or oligomer including at least one carbon-carbon unsaturated bond may be represented by the following Chemical Formula 7.

Chemical Formula 7

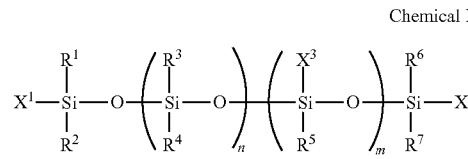

In Chemical Formula 7, $X^1$ to $X^3$ are each independently hydrogen, a C1 to C30 aliphatic organic group including a carbon-carbon unsaturated bond, a C6 to C30 aromatic organic group including a carbon-carbon unsaturated bond-containing substituent, or a C3 to C30 alicyclic organic group including a carbon-carbon unsaturated bond, provided that at least one of $X^1$ to $X^3$ is not hydrogen, $R^1$ to $R^7$ are each independently a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or triple bond in a ring; a substituted or unsubstituted C3 to C30 heterocycloalkyl group including a double bond or triple bond in a ring; a C3 to C30 alicyclic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; $NH_2$; a substituted or unsubstituted C1 to C30 amine group (—NRR' wherein R and R' are independently hydrogen, or a linear or branched C1 to C15 alkyl group); an isocyanate group; an isocyanurate group; a (meth)acrylate group; a halogen; —ROR' (wherein R is a substituted or unsubstituted C1 to C20 alkylene group and R' is hydrogen or a C1 to C20 linear or branched alkyl group); an acyl halide group (—RC(=O)X wherein R is a substituted or unsubstituted C1 to C20 alkylene group and X is a halogen); —C(=O)OR' (wherein R' is hydrogen or a C1 to C20 linear or branched alkyl group); —CN; or —C(=O)ONRR' (wherein R and R' are each independently hydrogen or a C1 to C20 linear or branched alkyl group), and n and m are each independently integers ranging from 0 to 300.

FIGS. 3 and 4, the first polymer layer may improve the interface adherence between the second matrix polymer 112 and the second polymer layer.

The interface adherence is further improved when the second matrix polymer 112 comprises a silicone resin. While not wanting to be bound by theory, it is understood that this is because, since the first polymer layer uses a siloxane-based second monomer or oligomer that is similar to the monomer used when a silicone resin is prepared as a polymerization component, the affinity between the polymers is improved. In this respect, the silicone resin that is used as the second matrix polymer 112 may be a polymer obtained by curing a siloxane-based second monomer or oligomer including at least one carbon-carbon unsaturated bond of the first polymer layer.

Also, when a first monomer including at least two thiol (—SH) groups at a terminal end is the same as a third monomer including at least two thiol (—SH) groups at a terminal end, the interface adherence between the first polymer layer and the second polymer layer may be further improved.

The light emitting particle 114 absorbs the light emitting energy of the light source 106 and emits the excited energy as light having a different wavelength. The light emitting particle 114 may control the light emitting wavelength in various ways. For example, when a red light emitting particle and a green light emitting particle are combined with a blue light emitting source, it may provide a white light emitting diode. Alternatively, when red, green, and blue light active particles are associated with the ultraviolet (UV) light emitting source, it may provide a white light emitting diode. In addition, when light active particles emitting light in various wavelengths is combined with a light source, it may provide a light emitting diode emitting light in the various wavelengths.

A method of manufacturing a light emitting diode may comprise disposing a buffer layer comprising a first matrix polymer on a light source; disposing a polymer layer on the buffer layer, wherein the polymer layer comprises an organic/inorganic hybrid polymer; and disposing an emission layer on the polymer layer, wherein the emission layer comprises a light emitting particle dispersed in a second matrix polymer, wherein one selected from the light source, the buffer layer, the emission layer, and a combination thereof comprises one selected from a sulfurous component, a nitrogenous component, and a combination thereof. The light source, buffer layer, polymer layer, and emission layer are as provided above. Each layer may be disposed by means know in the art, for example spin casting, solution casting, and the like. Hereinafter, the embodiments are illustrated in more detail with reference to examples. However, the following are exemplary embodiments and shall not be limiting.

EXAMPLES

Preparation Example 1

Synthesis of Green Semiconductor Nanocrystal

About 16 grams (g) of trioctylamine (hereinafter referred to as "TOA"), about 0.3 g of octadecyl phosphonic acid, and about 0.4 mmol of cadmium oxide are simultaneously introduced into a 125 mL flask with a reflux condenser and under vacuum while undergoing agitation, and heated to about 120° C. Then, after the temperature reaches about 120° C., nitrogen flows in and the reaction temperature is controlled to about 300° C.

Separately, Se powder is dissolved in trioctylphosphine (TOP) to provide a 2 M Se-TOP complex solution. About 2 mL of the 2 molar (M) Se-TOP complex solution is quickly injected into the reaction mixture that is agitated at about 300° C. and reacted for about 2 minutes.

After completing the reaction, the temperature of the reaction mixture is cooled as quickly as possible to room temperature, and a non-solvent of ethylene is added and centrifugation is performed. The supernatant of the solution excluding the centrifuged precipitant is discarded, and the precipitant is dispersed in toluene to synthesize a CdSe nanocrystal solution emitting light at 485 nm.

About 8 g of TOA, about 0.1 g of oleic acid, and about 0.4 millimole (mmol) of zinc acetate are simultaneously introduced into a 125 mL flask mounted with a reflux condenser, and the reaction temperature is controlled to about 300° C. while agitating it. About 1 wt % of the synthesized CdSe nanocrystal solution is added into the reactant, and about 2 mL of a 0.4 M S-TOP complex solution is slowly added thereto and reacted for about one hour to develop ZnS nanocrystals on the CdSe nanocrystal surface and to provide a CdSe//ZnS alloy nanocrystal through diffusion at the interface.

After completing the reaction, the temperature of the reaction mixture is cooled to room temperature as quickly as possible, and a non-solvent of ethanol is added thereto and centrifugation is performed. The supernatant of the solution excluding the centrifuged precipitant is discarded, and the precipitate is dispersed in toluene to synthesize a CdSe//ZnS alloy nanocrystal solution emitting light at 458 nm and having a size of about 5 nm.

About 8 g of TOA, about 0.1 g of oleic acid, about 0.05 mmol of cadmium oxide, and about 0.4 mmol of zinc acetate are simultaneously introduced into a 125 mL flask mounted with a reflux condenser, and the reaction temperature is controlled to about 300° C. while agitating it. About 1 wt % of the synthesized CdSe//ZnS nanocrystal solution is added into the reactant and about 2 mL of the 0.4 M S-TOP complex solution is slowly added thereto and reacted for about one hour to develop the CdSZnS nanocrystals on the CdSe//ZnS nanocrystal surface and to provide CdSe//ZnS/CdSZnS nanocrystals emitting light at about 532 nm.

After completing the reaction, the reaction mixture is cooled to room temperature as quickly as possible, and a non-solvent of ethanol is added thereto and centrifugation is performed. The supernatant of the solution excluding the centrifuged precipitant is discarded, and the precipitant is dispersed in toluene to synthesize the CdSe//ZnS/CdSZnS semiconductor nanocrystal solution. The nanocrystal has quantum efficiency of about 93%.

Preparation Example 2

Synthesis of Red Semiconductor Nanocrystal

About 200 g of TOA, about 5.4 g of oleic acid, and about 0.618 g of cadmium oxide are simultaneously introduced into a round-bottom flask with a reflux condenser, and the reaction temperature is controlled to about 300° C. while agitating the mixture. Separately, Se powder is dissolved in TOP to prepare a 0.2 M Se-TOP complex solution. About 6 mL of the 0.2 M Se-TOP complex solution is quickly injected into the reaction mixture that is being agitated and reacted for about one and a half minutes.

A mixture is obtained by slowly dripping a mixture prepared by mixing about 2.4 mmol of octane thiol with about 2 mL of TOA into the reaction mixture and reacting them for about 30 minutes.

Separately, about 16 mmol of zinc acetate is dissolved in about 4 mL of TOA to prepare a solution, and the solution is slowly dripped into the above mixture. After the dripping is ended, a mixed solution prepared by mixing about 20 mmol of octanethiol in about 4 mL of TOA is slowly dripped and reacted for about 60 minutes.

After completing the reaction, the temperature of the reaction mixture is cooled down to room temperature as quickly as possible, and a non-solvent of ethanol is added thereto and centrifugation is performed. The supernatant of the solution excluding the centrifuged precipitant is discarded, and the precipitant is dispersed in toluene to synthesize a solution where about 3 g of CdSe/CdS/ZnS nanocrystals is dispersed. Herein, the synthesized nanocrystal is confirmed to have a light emitting wavelength of about 602 nm and luminous efficiency of about 76%.

Preparation Example 3

Synthesis of Polymer-coated Green Semiconductor Nanocrystal

A semiconductor nanocrystal dispersion solution is prepared by dispersing the green semiconductor nanocrystals prepared according to Preparation Example 1 in toluene until the optical density (OD) (which is the absorption at the first absorption maximum wavelength of UV-Vis absorption spectrum) is about 0.04.

About 1 g of polyethylene-co-polyacrylic acid polymer having a weight average molecular weight of about 2000 is dissolved in TOA and heated at about 100° C., and about 5 mL of the semiconductor nanocrystal dispersion solution is dripped and reacted for about 45 minutes. Subsequently, green semiconductor nanocrystals coated with a polymer are prepared by cooling down the resultant solution to room temperature to obtain a precipitant and drying the precipitant.

Preparation Example 4

Synthesis of Polymer-coated Red Semiconductor Nanocrystal

Red semiconductor nanocrystals coated with a polymer are prepared according to the same method as Preparation Example 3, except that the red semiconductor nanocrystals prepared according to Preparation Example 2 are used instead of the green semiconductor nanocrystals prepared according to Preparation Example 1.

Comparative Example 1

Fabrication of Light Emitting Diode (LED) Device

A mixture is prepared by uniformly mixing about 0.2 g of the green semiconductor nanocrystals coated with a polymer according to Preparation Example 3, about 0.05 g of the red semiconductor nanocrystals coated with a polymer according to Preparation Example 4, and about 0.5 g of EG6301 A and about 0.5 g of EG6301, which are silicone resins produced by Dow Corning Corporation. An emission layer is formed by coating a blue light emitting diode light source, which is fabricated as a type of a surface mount device (SMD), with about 10 microliters (µL) of the silicone resin mixture, laminating a 0.2 millimeter (mm)-thick glass substrate with the size of an LED mold, coating the glass substrate with about 5 µL of the mixture, and curing them at about 150° C. for about 2 hours.

A pentaerythritol tetrakis (3-mercaptopropionate) monomer and a 1,3,5-triallyl-1,3,5-triazine-2,4,6-trione monomer are mixed at a mole ratio of 1:1, and about 1 wt % of oxyphenyl-acetic acid 2-(2-oxo-2-phenyl-acetoxy-ethoxy)-ethyl ester is added thereto as a photoinitiator to prepare a mixed solution.

A photoluminescent diode including a polymer barrier film is fabricated by coating the emission layer with about 5 µL of the mixed solution and exposing it to i-line UV of about 100 mW/cm$^2$ for about 10 minutes.

Example 1

Fabrication of Light Emitting Diode (LED) Device

A mixture is prepared by uniformly mixing about 0.2 g of the green semiconductor nanocrystals coated with a polymer according to Preparation Example 3, about 0.05 g of the red semiconductor nanocrystals coated with a polymer according to Preparation Example 4, and about 0.5 g of EG6301 A and about 0.5 g of EG6301, which are silicone resins produced by Dow Corning Corporation.

A blue light emitting diode light source fabricated in a type of a surface mount device (SMD) is coated with about 5 µL of the silicone resin EG6301 A, and about 1.5 µL of a composition prepared by mixing Ormocore produced by Fraunhofer Institute with about 1 wt % of bis-acyl-phosphine oxide as a photoinitiator is applied to the upper surface of the silicone resin EG6301 A.

An emission layer is formed by exposing the resultant structure to i-line UV of about 100 mW/cm$^2$ for about 10 minutes, applying about 3.5 µL of silicone resin EG6301 A thereto, laminating a 0.2 mm-thick glass substrate with the size of an LED mold, coating the glass substrate with about 5 µL of the mixture, and curing it at about 150° C. for about 2 hours.

A pentaerythritol tetrakis (3-mercaptopropionate) monomer and a 1,3,5-triallyl-1,3,5-triazine-2,4,6-trione monomer are mixed at a mole ratio of 1:1, and about 1 wt % of oxyphenyl-acetic acid 2-(2-oxo-2-phenyl-acetoxy-ethoxy)-ethyl ester is added thereto as a photoinitiator to prepare a mixed solution.

A photoluminescent diode including a polymer barrier film is fabricated by coating the emission layer with about 5 µL of the mixed solution and exposing it to i-line UV of about 100 mW/cm² for about 10 minutes.

Ten photoluminescent diodes of Comparative Example 1 and 10 photoluminescent diodes of Example 1 are put into a chamber set to the conditions of a temperature of about 85° C. and relative humidity of about 85%, and their luminances according to time are measured by driving them with a current of about 120 milliamperes (mA). The measurement results are presented in the following Table 1.

TABLE 1

|  |  | Sample Nos. | 0 h | 24 h | 72 h | 144 h | 250 h |
|---|---|---|---|---|---|---|---|
| Comp. Ex. 1 | Luminance (lm) | 1 | 4.93 | 5.09 | 4.88 | 4.26 | 3.40 |
|  |  | 2 | 4.63 | 4.69 | 4.42 | 3.62 | 2.41 |
|  |  | 3 | 4.74 | 4.56 | 3.82 | 2.71 | 1.89 |
|  |  | 4 | 4.94 | 4.60 | 4.09 | 2.94 | 2.18 |
|  |  | 5 | 5.21 | 5.06 | 4.81 | 4.42 | 3.64 |
|  |  | 6 | 4.93 | 5.00 | 4.75 | 4.48 | 3.92 |
|  |  | 7 | 5.00 | 5.08 | 4.73 | 4.22 | 3.10 |
|  |  | 8 | 5.08 | 4.83 | 3.47 | 2.61 | 1.95 |
|  |  | 9 | 4.91 | 4.89 | 4.60 | 4.29 | 3.84 |
|  |  | 10 | 4.35 | 4.27 | 4.04 | 3.60 | 3.10 |
| Ex. 1 | Luminance (lm) | 1 | 4.45 | 5.20 | 5.11 | 4.80 | 4.41 |
|  |  | 2 | 4.36 | 5.07 | 4.99 | 4.74 | 4.27 |
|  |  | 3 | 4.16 | 4.86 | 4.70 | 4.38 | 3.91 |
|  |  | 4 | 4.40 | 4.82 | 4.66 | 4.28 | 3.85 |
|  |  | 5 | 4.18 | 4.79 | 4.75 | 4.56 | 4.35 |
|  |  | 6 | 3.90 | 4.63 | 4.53 | 4.34 | 4.01 |
|  |  | 7 | 4.33 | 5.06 | 4.95 | 4.65 | 4.24 |
|  |  | 8 | 4.00 | 4.67 | 4.65 | 4.48 | 4.27 |
|  |  | 9 | 4.33 | 5.04 | 4.99 | 4.75 | 4.48 |
|  |  | 10 | 3.82 | 4.23 | 4.25 | 4.16 | 3.75 |

Referring to Table 1, the luminance of four of the photoluminescent diodes of Comparative Example 1 decreased to less than about 3 lm after about 250 hours, whereas all of the photoluminescent diodes of Example 1 provided greater than about 3.5 lm after about 250 hours. It may be seen from the results that the photoluminescent diodes of Example 1 have stable efficiency and a small deviation between the samples. Thus the photoluminescent diodes of Example 1 provide improved reliability.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode, comprising:
a light source;
a buffer layer disposed on the light source and comprising a first matrix polymer;
a polymer layer disposed on the buffer layer and comprising an organic/inorganic hybrid polymer; and
an emission layer disposed on the polymer layer and comprising a light active particle dispersed in a second matrix polymer,
wherein one selected from the light source, the buffer layer, the emission layer, and a combination thereof comprises one selected from sulfurous component, a nitrogenous component, and a combination thereof.

2. The light emitting diode of claim 1, further comprising a reflector disposed on a side of the light source opposite the emission layer.

3. The light emitting diode of claim 2, wherein the reflector comprises silver.

4. The light emitting diode of claim 3, having a luminance after 250 hours of greater than 80% of an initial luminance.

5. The light emitting diode of claim 1, wherein the emission layer comprises one selected from a sulfurous component, a nitrogenous component, and a combination thereof.

6. The light emitting diode of claim 1, wherein the first matrix polymer comprises a silicone resin.

7. The light emitting diode of claim 1, wherein the light active particle is selected from a phosphor, a semiconductor nanocrystal, a metal nanocrystal, a metal oxide nanocrystal, and a combination thereof.

8. The light emitting diode of claim 7, wherein the semiconductor nanocrystal is selected from a Group II-VI compound, a Group III-V compound, a Group IV-VI compound, a Group IV element, a Group IV compound, and a combination thereof.

9. The light emitting diode of claim 1, wherein a polymer comprising a carboxyl group (—COOH) or a salt thereof is disposed on the light active particle.

10. The light emitting diode of claim 9, wherein the polymer is selected from a poly(alkylene-co-acrylic acid), a poly(alkylene-co-methacrylic acid), a salt thereof, and a combination thereof.

11. The light emitting diode of claim 1, wherein the polymer layer including the organic/inorganic hybrid polymer has porosity of less than or equal to about 5 volume percent.

12. The light emitting diode of claim 1, wherein the organic/inorganic hybrid polymer comprises a first moiety including a siloxane bond (—Si—O—Si—, wherein each Si is tetravalent), a second moiety including a siloxane bond and at least one organic functional group, and a third moiety including a siloxane bond and a cross-linked structure of at least one reactive functional group.

13. The light emitting diode of claim 1, wherein the organic/inorganic hybrid polymer further comprises a fourth moiety including an —O-M-O— bond, wherein M is selected from Al, Sn, Ti, Zr, Ge, B, and a combination thereof.

14. The light emitting diode of claim 1, wherein the light emitting diode further comprises an interlayer selected from a second buffer layer including a third matrix polymer, a transparent plate, and a combination thereof between the polymer layer including the organic/inorganic hybrid polymer, and the emission layer.

15. The light emitting diode of claim 1, wherein the light emitting diode further comprises a polymer barrier film disposed on the emission layer, wherein the polymer barrier film is a polymer of a first monomer including at least two thiol (—SH) groups at a terminal end and a second monomer including at least two carbon-carbon unsaturated bond-containing group.

16. The light emitting diode of claim 1, wherein the light emitting diode further comprises a polymer barrier film disposed on the emission layer, wherein the polymer barrier film comprises a first polymer layer including a first polymer of a first monomer including at least two thiol (—SH) groups at a terminal end and a siloxane second monomer or oligomer including at least one carbon-carbon unsaturated bond, and a second polymer layer including a second polymer of a third monomer including at least two thiol (—SH) groups at a terminal end and a fourth monomer including at least two carbon-carbon unsaturated bond-containing groups.

17. The light emitting diode of claim 16, wherein the second matrix polymer is a silicone resin.

18. The light emitting diode of claim 16, wherein the second matrix polymer is a product of curing a siloxane second monomer or oligomer including at least one carbon-carbon unsaturated bond of the first polymer layer.

* * * * *